(12) United States Patent
Kim

(10) Patent No.: US 9,105,504 B2
(45) Date of Patent: Aug. 11, 2015

(54) SEMICONDUCTOR DEVICE AND METHOD FOR FORMING THE SAME

(71) Applicant: SK hynix Inc., Icheon-si (KR)

(72) Inventor: Jung Sam Kim, Seoul (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 14/229,637

(22) Filed: Mar. 28, 2014

(65) Prior Publication Data
US 2015/0001604 A1 Jan. 1, 2015

(30) Foreign Application Priority Data
Jul. 1, 2013 (KR) .......................... 10-2013-0076359

(51) Int. Cl.
*H01L 27/108* (2006.01)
*H01L 49/02* (2006.01)

(52) U.S. Cl.
CPC .... *H01L 27/10814* (2013.01); *H01L 27/10855* (2013.01); *H01L 27/10894* (2013.01); *H01L 27/10823* (2013.01); *H01L 27/10876* (2013.01); *H01L 28/90* (2013.01)

(58) Field of Classification Search
CPC ............ H01L 27/10852; H01L 27/108; H01L 27/10894; H01L 27/115; H01L 27/10814; H01L 27/10855; H01L 27/10876; H01L 27/10885; H01L 27/10823
USPC .......................................... 438/253; 257/300
See application file for complete search history.

(56) References Cited

U.S. PATENT DOCUMENTS

2010/0159668 A1   6/2010  Shin
2012/0132968 A1*  5/2012  Choi ............................. 257/296

FOREIGN PATENT DOCUMENTS

KR   10-2012-0058327 A    6/2012

\* cited by examiner

*Primary Examiner* — Monica D Harrison

(57) ABSTRACT

A semiconductor device and a method for forming the same are disclosed, which relate to a reservoir capacitor. The semiconductor device includes: an active region defined by forming a device isolation region over a semiconductor substrate of peripheral region; gate electrodes formed over the active region; a plurality of metal lines over the gate electrodes; a plurality of contact slits elongated into the gate electrode at a position between the plurality of metal lines, a plurality of the first capacitors respectively formed over the plurality of metal lines, and a plurality of the second capacitors respectively formed over the plurality of contact slits.

20 Claims, 11 Drawing Sheets

Fig.1 (ii)

Fig.1 (iii)

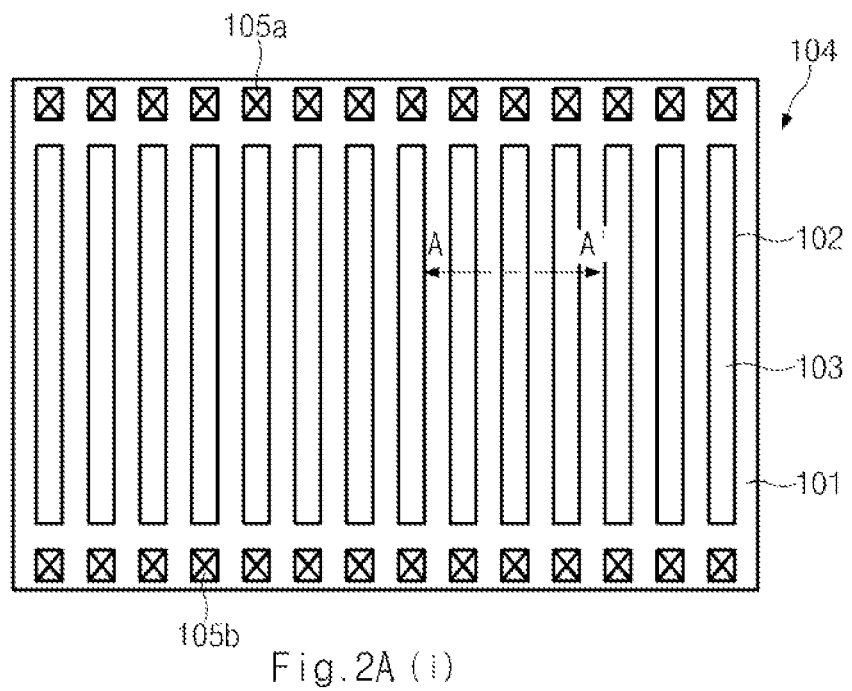
Fig.2A (i)
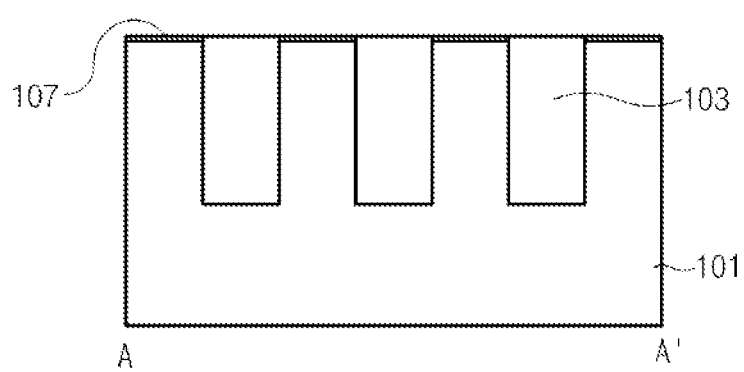
Fig.2A (ii)

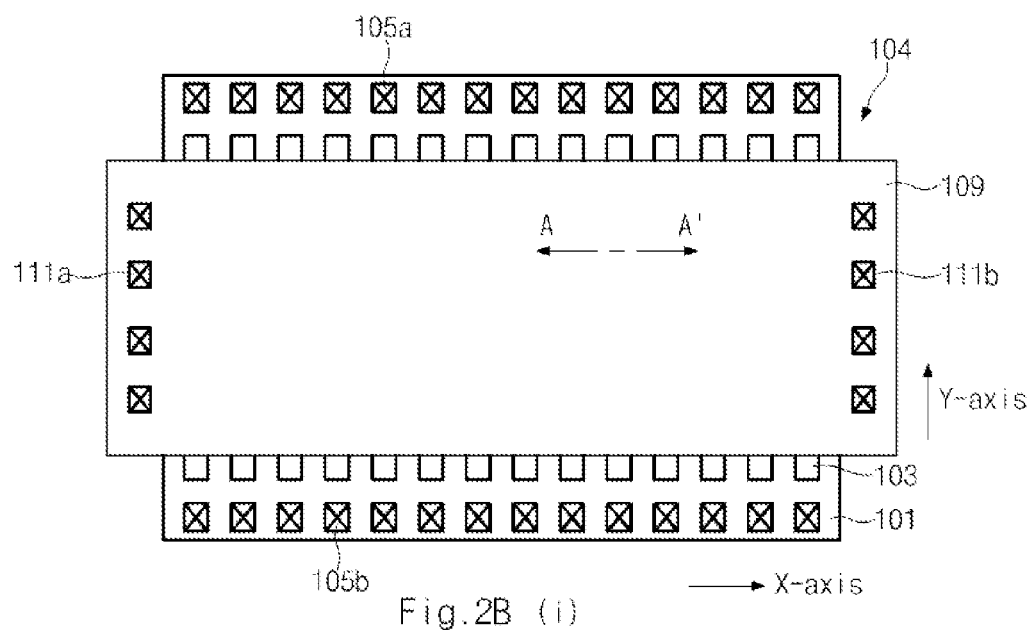
Fig.2B (i)
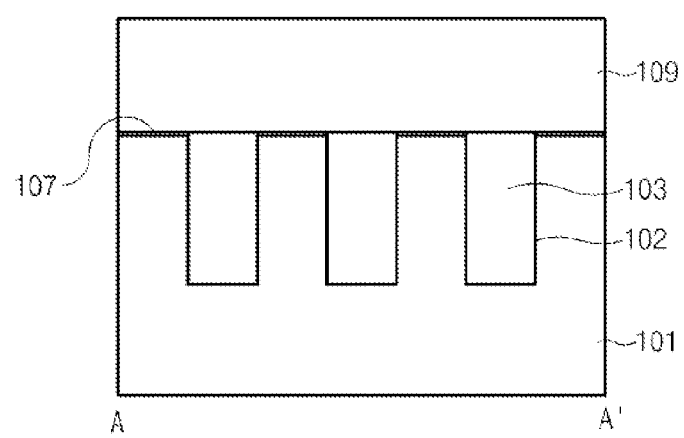
Fig.2B (ii)

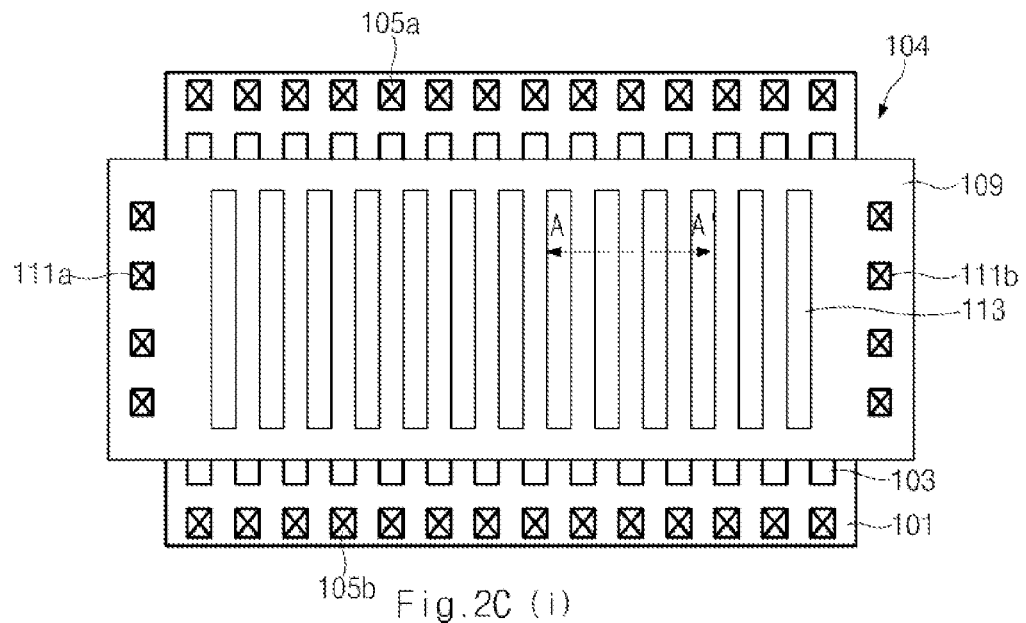
Fig.2C (i)
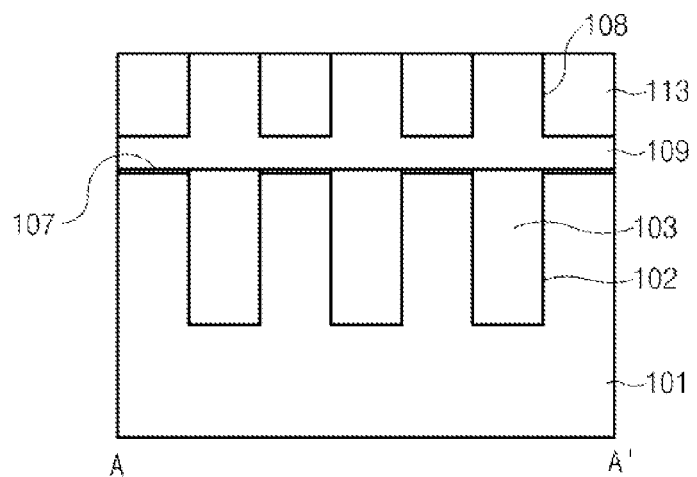
Fig.2C (ii)

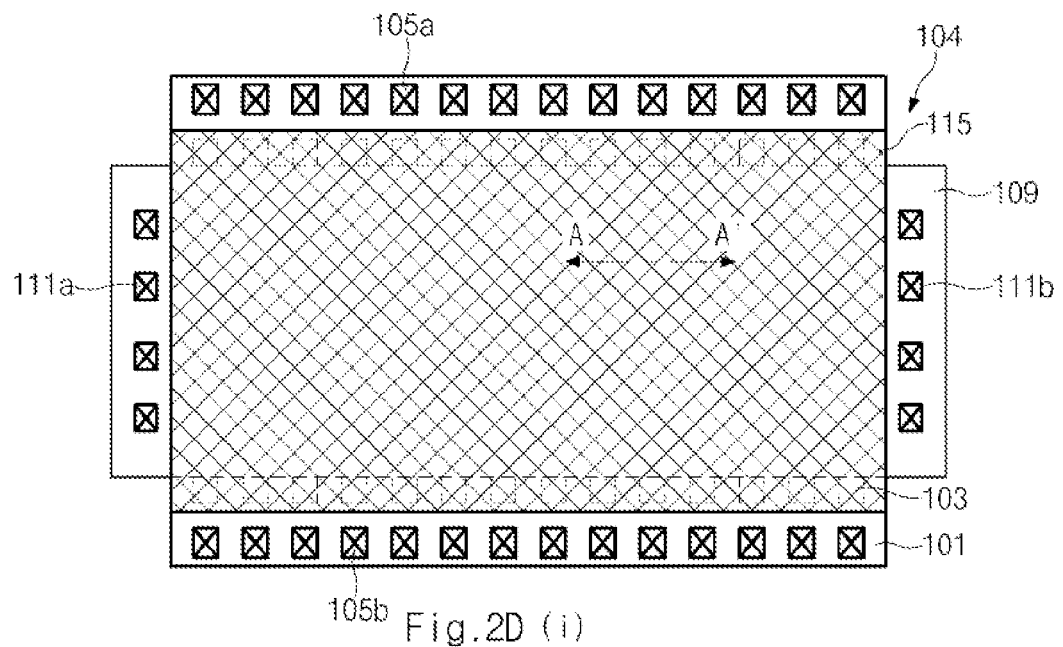
Fig.2D (i)
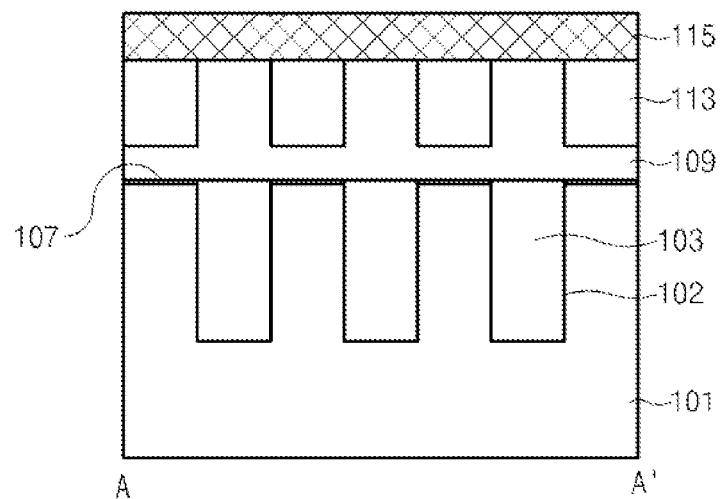
Fig.2D (ii)

Fig.2E (ii)

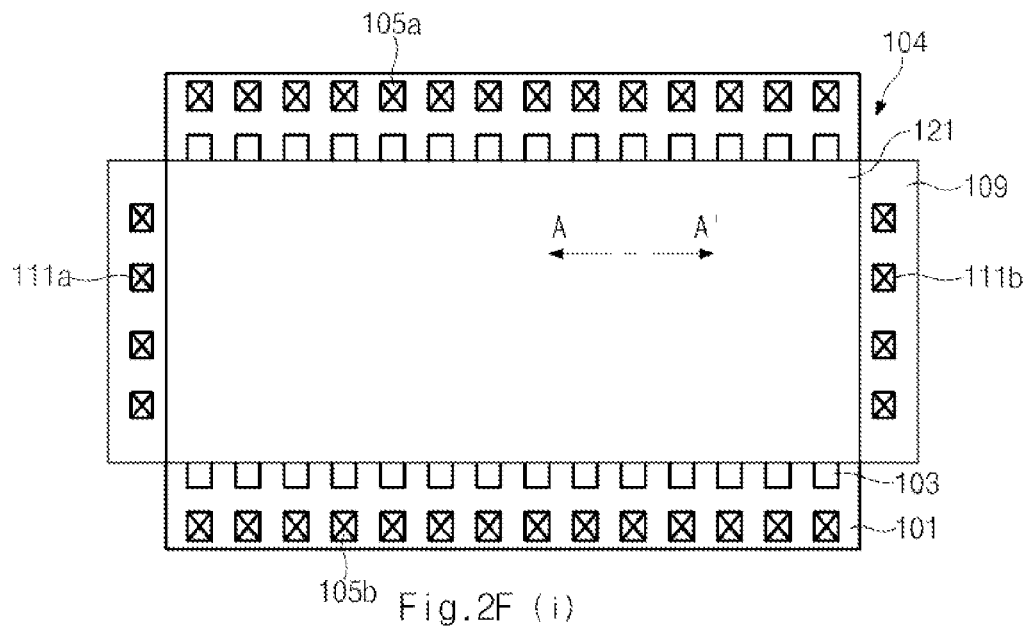
Fig.2F (i)
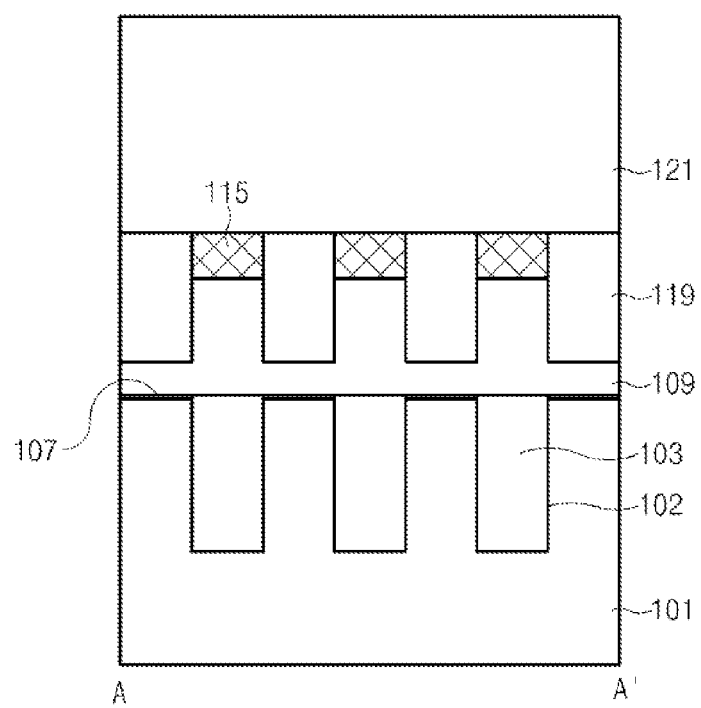
Fig.2F (ii)

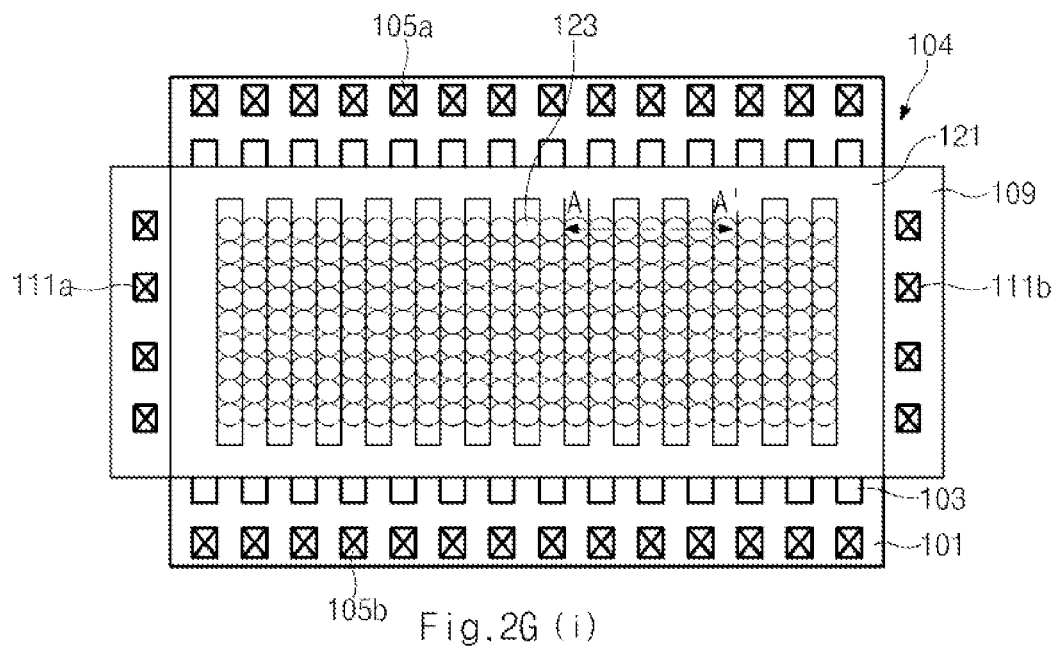
Fig.2G (i)
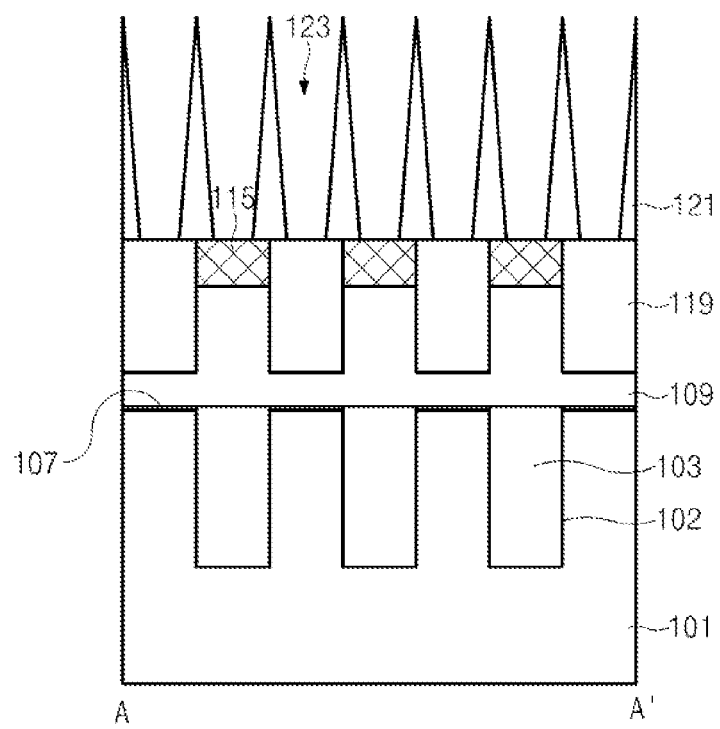
Fig.2G (ii)

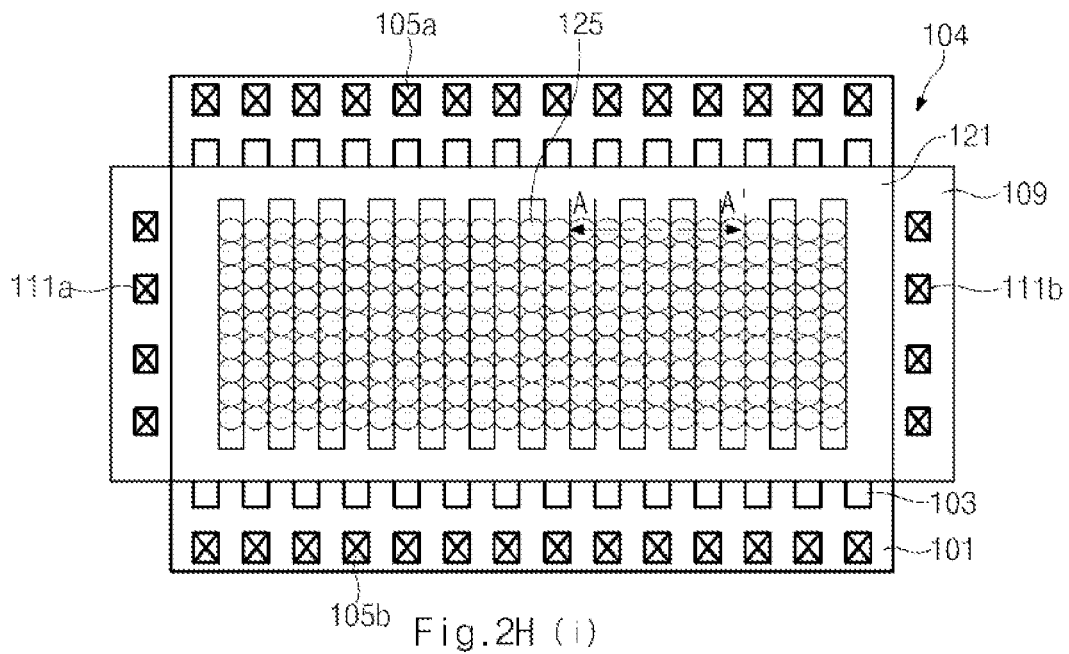
Fig.2H (i)
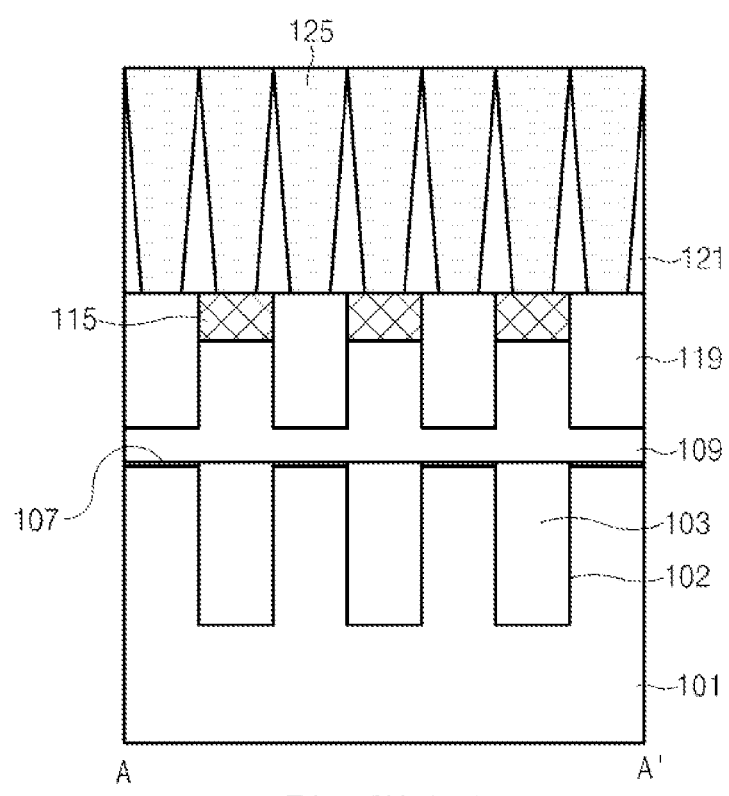
Fig.2H (ii)

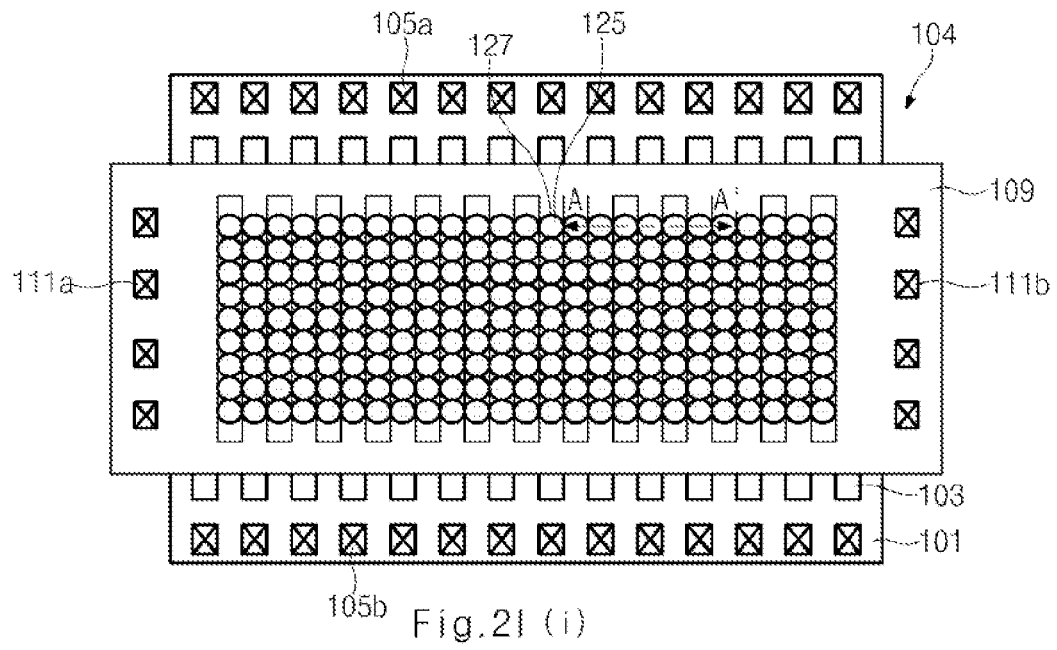
Fig.2I (i)
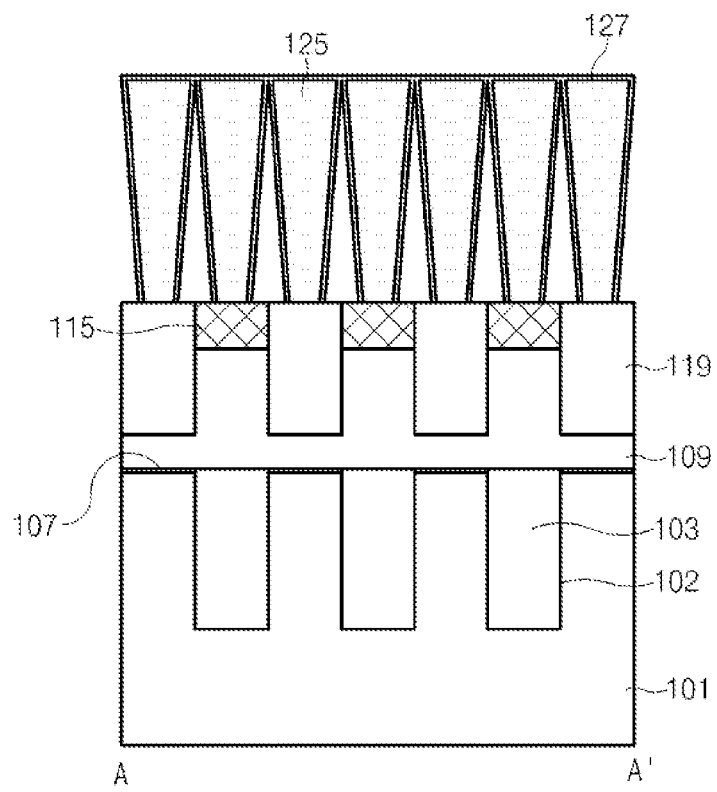
Fig.2I (ii)

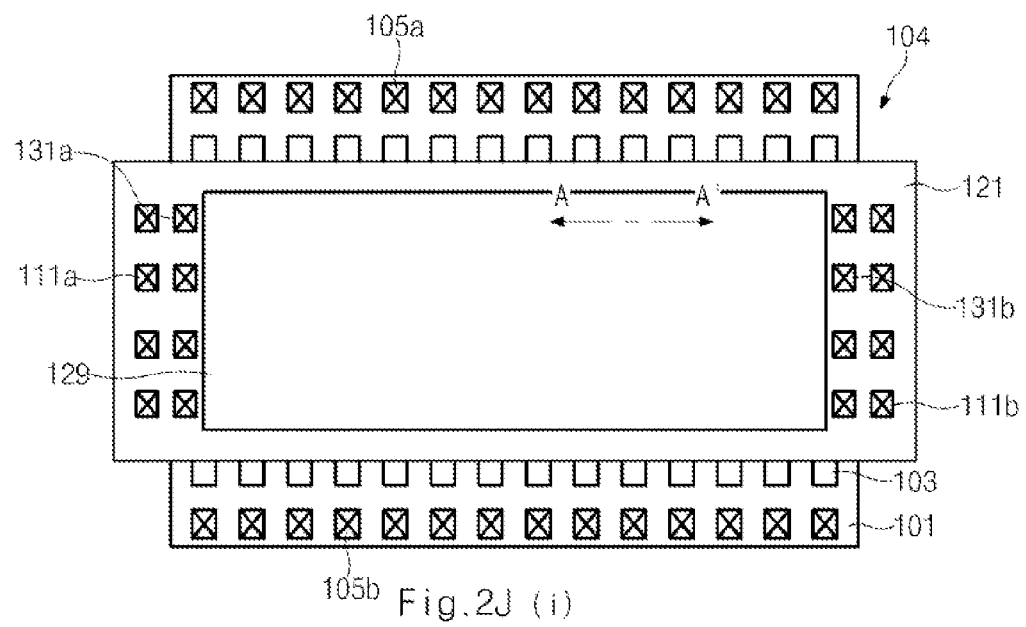
Fig.2J (i)
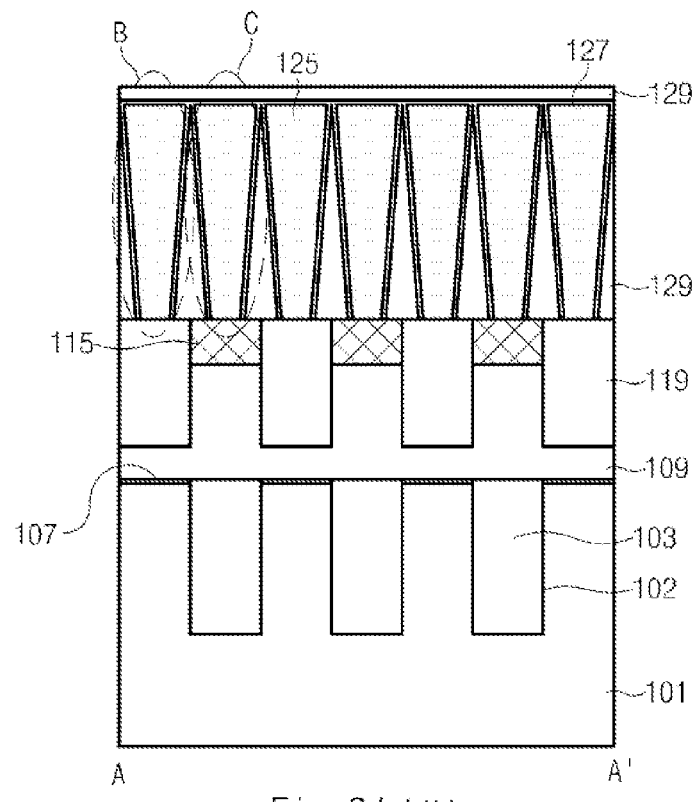
Fig.2J (ii)

SEMICONDUCTOR DEVICE AND METHOD FOR FORMING THE SAME

CROSS-REFERENCE TO RELATED APPLICATION

The priority of Korean patent application No. 10-2013-0076359 filed on 1 Jul. 2013, the disclosure of which is hereby incorporated by reference in its entirety, is claimed.

BACKGROUND

Embodiments relate to a semiconductor device and a method for forming the same, and more particularly to a reservoir capacitor.

A semiconductor device includes a plurality of circuits. Generally, a semiconductor memory device such as a dynamic random access memory (DRAM) includes a cell region in which a circuit for storing data is formed, a core region for accessing the data stored in the cell region, and a peripheral region in which a circuit configured to drive the semiconductor memory device as well as to carry out data input/output (I/O).

The cell region includes a plurality of memory cells, each of which includes a cell transistor and a cell capacitor, and the memory cells are arranged in row and column directions and in an array shape. A group of memory cells arranged in an array shape is referred to as a unit cell array. In order to access a specific memory cell of a unit cell array, a row and a column are designated separately from each other, and a circuit for designating the row and the column is formed in a core region located adjacent to the cell region.

The core region includes a sub-word line driver, a sense-amplifier, and the like. In this case, the sub-word line driver is configured to select a sub-word line coupled to the specific memory cells of the unit cell array. Since electric charges stored in a cell capacitor of a memory cell are small, it is difficult for the sense-amplifier to quickly convert the electric charges into a digital signal and output the digital signal to an external part, such that the small amount of electric charges can be amplified.

The DRAM is implemented as a bank structure that includes a plurality of unit cell arrays and a plurality of core regions. For example, a 512-Mbit DDR2 device includes four banks. In more detail, a peripheral region including a power circuit, a free decoder, an input buffer, an output buffer, etc. is located between a plurality of banks. Meanwhile, a reservoir capacitor is located in the vicinity of the power circuit so as to prevent the occurrence of noise caused by power-potential switching.

In the case of forming a transistor of the cell region, reservoir capacitors are simultaneously formed in the peripheral region in such a manner that the reservoir capacitors can be formed in many more regions of the semiconductor device. In general, the reservoir capacitor may include a MOS-type capacitor which is formed including a gate and a source/drain.

However, with the increasing integration degree of semiconductor devices, many more circuits must be formed in a limited-sized chip region. As a result, the semiconductor device is gradually reduced in size in proportion to the increasing integration degree of the semiconductor device. Specifically, as a design rule is gradually reduced in a memory device such as DRAM, a unit cell size of a semiconductor device is gradually reduced. Likewise, as a design rule is gradually reduced in the peripheral region, semiconductor device elements provided in the peripheral region is gradually reduced in size. Therefore, a reservoir capacitor formed in the vicinity of the power circuit is gradually reduced in size, as well.

Specifically, since a typical reservoir capacitor is configured to form an array by interconnecting two units, and a large-sized region is required to form the reservoir capacitor, there may be a structural limitation in noise reduction and chip integration.

SUMMARY

Various embodiments are directed to providing a semiconductor device and a method for forming the same to address issues of the related art.

An embodiment relates to a semiconductor device and a method for forming the same in which a reservoir capacitor is formed by alternately arranging a cell capacitor and a MOS capacitor, resulting in increased capacitance of the reservoir capacitor.

In accordance with an aspect of the embodiment, a semiconductor device includes: an active region defined by forming a device isolation region over a semiconductor substrate of peripheral region; gate electrodes formed over the active region; a plurality of metal lines over the gate electrodes; a plurality of contact slits, each extending between the gate electrodes and further extending between the plurality of metal lines; a plurality of the first capacitors respectively formed over the plurality of metal lines; and a plurality of the second capacitors respectively formed over the plurality of contact slits.

The plurality of the first capacitors and the plurality of the second capacitors are alternately arranged.

The gate electrodes include: a plurality of first gate electrodes spaced apart from each other by a predetermined distance in the active region, wherein the first gate electrodes are formed in a line shape; and a second gate electrode each extending from the plurality of first gate electrodes and provided in the active region.

Each of the contact slits is formed in the second gate electrode and extends between the plurality of metal lines.

Each of the contact slits is arranged in the second gate electrode, and is located over the active region between the first gate electrodes.

A top surface of each of the contact slits substantially levels with a top surface of each of the plurality of metal lines, and wherein a bottom surface of each of the contact slits is located in the second gate electrode.

Top surfaces of each of the plurality of contact slits substantially level with top surfaces of the plurality of metal lines, and wherein bottom surfaces of the plurality of contact slits are located at a lower level than bottom surfaces of the plurality of metal lines.

The semiconductor device further may comprise a gate insulation film formed between the active region and the second gate electrode.

The semiconductor device further may comprise a metal contact coupled to the plurality of metal lines.

The plurality of the first capacitors and the plurality of the second capacitors respectively include: a pillar-shaped lower electrode; a dielectric film formed over the lower electrode to a predetermined thickness; and an upper electrode formed over the dielectric film.

In accordance with another aspect of the embodiment, a method for forming a semiconductor device includes: forming a plurality of first gate electrodes spaced apart from each other by a predetermined distance in an active region; forming a second gate electrode over the plurality of first gate electrodes and the active region; forming a plurality of metal lines spaced apart from each other by a predetermined distance, each of the plurality of metal lines formed over the second gate electrode; forming a plurality of contact slits extending into the second gate electrode, each of the contact slits placed between the plurality of metal lines; and forming a plurality of the second capacitors, each the first capacitor formed over a respective one of the plurality of contact slits, and forming a plurality of cell reservoir capacitors, each the second capacitor formed over a respective one the plurality of metal lines, wherein the plurality of the second capacitors and the plurality of the first capacitors are alternately arranged.

The forming the plurality of first gate electrodes includes: etching the active region to form a plurality of trenches spaced apart from each other by a predetermined distance in the active region; and filling a gate material in the plurality of trenches.

The method further may comprise after formation of the plurality of first gate electrodes, forming a gate insulation film over the active region between the plurality of first gate electrodes.

The forming the plurality of contact slits includes: forming the plurality of contact slits in the second gate electrode located in the active region between the plurality of first gate electrodes.

The forming the plurality of metal lines includes: forming a plurality of first contact slit holes spaced apart from each other by a predetermined distance by etching the second gate electrode; forming a plurality of first contact slits by filling a conductive material in the plurality of first contact slit holes; depositing a metal layer over the plurality of first contact slits and the second gate electrode; and etching the metal layer to divide the metal layer into the plurality of metal lines and form a plurality of second contact slit holes spaced apart from each other by a predetermined distance.

The method further may comprise forming a plurality of second contact slits by filling a conductive material in the plurality of second contact slit holes.

The plurality of first contact slits and the plurality of second contact slits include substantially the same material.

The alternately arranging of the plurality of the second capacitors and the plurality of the first capacitors includes: forming an interlayer insulation film between the plurality of contact slits and the plurality of metal lines; forming a plurality of lower electrode holes by etching the interlayer insulation film in such a manner that each contact slit and each metal line are alternately exposed; forming a plurality of lower electrodes by filling a conductive material in the plurality of lower electrode holes; removing an interlayer insulation film formed between the plurality of lower electrodes; forming a dielectric film over external surfaces of the plurality of lower electrodes; and forming an upper electrode over the dielectric film.

The plurality of the second are coupled to the second gate electrode, wherein the plurality of the first capacitors are respectively coupled to the plurality of metal lines.

The plurality of contact slits include polysilicon, and the plurality of metal lines include tungsten (W) material.

It is to be understood that both the foregoing general description and the following detailed description of embodiments are exemplary and explanatory.

BRIEF DESCRIPTION OF THE DRAWINGS

FIG. 1(*ii*) is a cross-sectional view taken along line A-A' of FIG. 1A(i), and FIG. 1(*iii*) is a cross-sectional view of a capacitor in the cell region of the semiconductor device of FIG. 1(*i*).

FIGS. 2A(ii) to 2J(ii) are cross sectional views of lines A-A' of FIGS. 2A(i) to 2J(i), respectively.

DESCRIPTION OF EMBODIMENTS

Reference will now be made in detail to certain embodiments, examples of which are illustrated in the accompanying drawings. Wherever possible, the same reference numbers will be used throughout the drawings to refer to the same or like parts. In the following description, a detailed description of related known configurations or functions will be omitted.

The embodiments relate to a reservoir capacitor for reducing noise in a peripheral region. In the embodiments, a cell capacitor (the first capacitor) and a MOS capacitor (the second capacitor)(also referred to herein as a reservoir capacitor, or a MOS reservoir capacitor) are simultaneously used, thereby possibly resulting in a size of a peripheral area being reduced and capacitance of the reservoir capacitor being increased. A cell capacitor is formed in the peripheral region, is formed capacitor of cell region at the same time.

A semiconductor device and a method for forming the same according to the embodiment will hereinafter be described with reference to FIGS. 1 to 2J.

Figure 1:
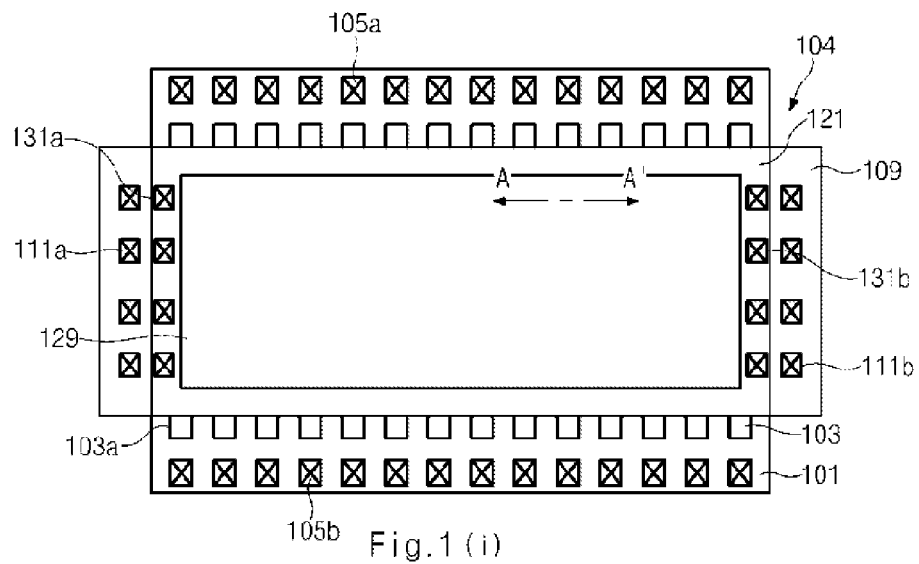
FIG. 1(*i*) is a plan view of a semiconductor device according to an embodiment.
Figure 1:
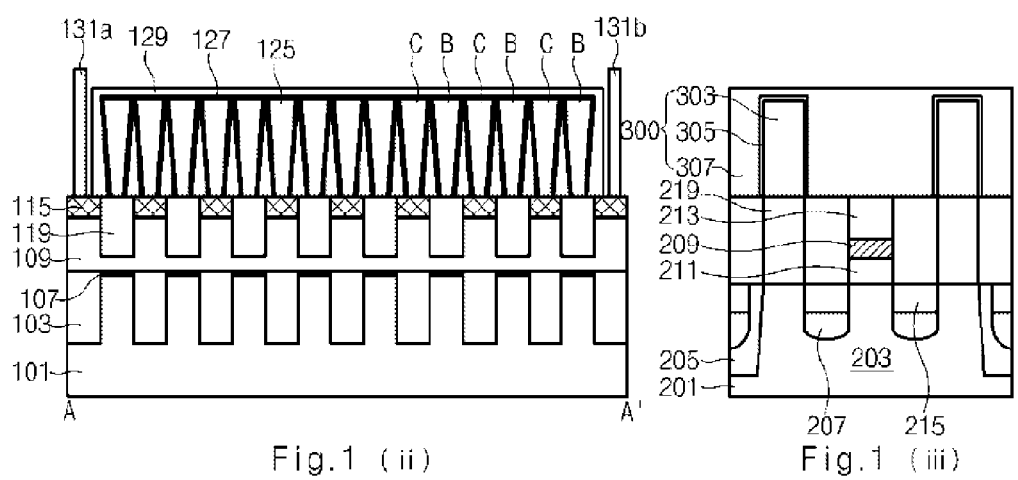

FIG. 1 is a plan view and a cross-sectional view illustrating a semiconductor device according to an embodiment. The view (i) is a plan view illustrating a reservoir capacitor of the peripheral region in the semiconductor device, and the view (ii) is a cross-sectional view illustrating a reservoir capacitor of the semiconductor device. The view (ii) is a cross-sectional view illustrating the semiconductor device taken along the line A-A' of FIG. 1(*i*). The view (iii) is a cross-sectional view illustrating a capacitor of the cell region in the semiconductor.

Referring to FIG. 1(*i*) and FIG. 1(*ii*), the semiconductor device according to the embodiment forms a device isolation region 104 over a semiconductor substrate so as to define an active region 101 in the peripheral region. That is, an outside region enclosing the active region 101 is used as a device isolation region 104. First gate electrodes 103 formed as a line shape in the active region 101 are spaced apart from each other by a predetermined distance.

A second gate electrode 109 is formed over the first gate electrode 103. A metal line 115 is formed over the second gate electrode 109. A contact slit 119 is formed in the second gate electrode 109 and extends between the metal lines 115. The contact slit 119 is formed over an active region 101 to be provided between the first gate electrodes 103 or over a device isolation region 103a in the active region 101 to be provided between the first gate electrodes 103. So, the first gate electrode 103 formed in a device isolation region 103a, which may be a field oxide (FOX), between two neighboring active regions. Under this structure, the embodiments utilize the device isolation region 103a to form the reservoir capacitors, thus minimizing a unit chip size. A MOS capacitor B is formed over the contact slit 119 and a cell capacitor C (the first capacitor) is formed over the metal line 115 in such a manner that the MOS capacitor B and the cell capacitor are alternately arranged. As a result, the above-mentioned embodiment can increase capacitance of the MOS capacitor B without increasing a size of the peripheral region by forming the MOS capacitor B (the second capacitor) to be coupled to the first gate electrode 103 and the second gate electrode 109 through the contact slit 119. As can be seen from the cross-sectional view (ii) of the semiconductor device, a total length of the second gate electrodes 109 and the first gate electrodes 103 is increased. Since the first gate electrodes 103 are spaced apart from each other by a predetermined distance in the active region 101, such that a total length of the first gate electrode 103 is increased, resulting in increased capacitance of the MOS capacitor B.

In addition, according to the above-mentioned embodiment, each MOS capacitor B and each cell capacitor C are alternately arranged, and the arranged MOS capacitors B are coupled in parallel to each other, resulting in increased capacitance. In addition, the MOS capacitor B is formed as a single unit, minimizing an area occupied by the MOS capacitors B.

Referring to FIG. 1(iii), in the cell region, buried gates 207 are formed over the active region 203 in the semiconductor substrate 201 and a hard mask film 215 is formed over the buried gate 207. A bit line contact 211, a bit line 209, and a hard mask film 213 are sequentially formed over the active region 203. A storage node contact 219 is formed at a sidewall of the bit line contact 211, a bit line 209, and a hard mask film 213. A cell capacitor 300 coupled to the storage node contact 219 comprises a storage node 303, dielectric films 305, and a plate node 307. A cell capacitor C is formed in the peripheral region at the same time capacitor 300 of cell region is formed.

A method for forming the semiconductor device according to an embodiment will hereinafter be described with reference to FIGS. 2A to 23. FIGS. 2A to 23 are plan views and cross-sectional views illustrating a method for forming the semiconductor device according to an embodiment. In each of FIGS. 2A to 23, the view (i) is a plan view illustrating a reservoir capacitor of the semiconductor device, and the view (ii) is a cross-sectional view illustrating a reservoir capacitor of the semiconductor device.

Referring to FIG. 2A, a trench 102 is formed in the active region 101. Thereafter, a gate material is filled in the trench 102 such that a first gate electrode 103 is formed. In this case, the first gate electrodes 103 are spaced apart from each other by a predetermined distance in the form of a line. In addition, first metal contacts (105a, 105b) are formed at both ends of the active region 101, and a pair of first metal contacts (105a, 105b) may be provided as a single first gate electrode 103.

Thereafter, a gate insulation film 107 is formed over the active region 101. Here, the gate insulation film 107 may be a double-layered composite layer comprised of a silicon oxide layer and a silicon nitride layer. Alternately, some regions may serve as a nitrified silicon oxide layer. For example, nitrification may be carried out using any one of annealing, rapid thermal annealing (RTA), laser RTA, etc. using nitrogen gas such as NH$_3$. In addition, the nitrification may be carried out by plasma nitrification, plasma ion implantation, plasma enhanced CVD, high-density plasma CVD (HDP-CVD), or radical nitrification. After completion of the above-mentioned nitrification processing, the material may be annealed (or heat-processed) under inert environment including inert gas such as helium (He) or argon (Ar).

Referring to FIG. 2B, a gate conductive material is deposited over the gate insulation film 107 and the first gate electrode 103, so that a second gate electrode 109 is formed. As can be seen from the cross-sectional view (ii) of FIG. 2b, the first gate electrode 103 is coupled to the second gate electrode 109, and the first gate electrode 103 is meanderingly formed, such that a total length of the gate electrode is increased, resulting in increased capacitance.

In this case, a length along a shorter axis (or Y-axis) of the second gate electrode 109 is shorter than the active region 101. Thus, when viewed from the top, the first metal contacts (105a, 105b) are exposed outside of the second gate electrode 109. A length along a longer axis (or X-axis) of a length of the second gate electrode 109 is longer than the active region 101. Thus the second gate electrode 109 extends into the peripheral region 104. The second gate electrode 109 may further extend over a neighboring active region 101.

Thereafter, second metal contacts (111a, 111b) are formed at both ends (i.e., in the peripheral region 104) of the longer axis (X-axis) of the second gate electrode 109. That is, the second metal contacts (111a, 111b) are formed over the second gate electrode 109 located over the peripheral region 104.

Referring to FIG. 2C, after a first contact slit hole 108 of a line type is formed by etching the second gate electrode 109 between the first gate electrodes 103, a contact material is filled in the first contact slit hole 109 and then planarized so that a first contact slit 113 is formed.

In this case, the first electrode 103 or the second electrode 109 may be formed of a conductive material, for example, polysilicon or ITO (indium-tin oxide). In addition, the first gate electrode 103 and the second gate electrode 109 may include a metal material. For example, each of the first gate electrode 103 and the second gate electrode 109 may include aluminum (Al), gold (Au), beryllium (Be), bismuth (Bi), cobalt (Co), copper (Cu), hafnium (Hf), indium (In), manganese (Mn), molybdenum (Mo), nickel (Ni), lead (Pb), palladium (Pd), platinum (Pt), rhodium (Rh), rhenium (Re), ruthenium (Ru), tantalum (Ta), telium (Te), titanium (Ti), tungsten (W), zinc (Zn), zirconium (Zr), or a combination thereof. The first gate electrode 103 and the second gate electrode 109 may be formed by chemical vapor deposition (CVD), plasma enhanced CVD (PECVD), low pressure CVD (LPCVD), physical vapor deposition (PVD), sputtering, or atomic layer deposition (ALD).

Referring to FIG. 2D, a metal material is deposited over the second gate electrode 109 including the first contact slit 113 so that a metal line 115 is formed. Here, the metal line 115 may be formed of a metal material such as tungsten (W).

Subsequently, referring to FIG. 2E, the metal line 115 is etched to form a second contact slit hole 116 exposing a top surface of the first contact slit 113, and a contact material is filled in the second contact slit hole 116 and planarized so that a second contact slit 117 is formed. In this case, the contact material may include polysilicon and the first contact slit 113 and the second contact slit 117 may be formed of the same material. For convenience of description and better understanding, the first contact slit 113 and the second contact slit 117 may be generically referred to as a contact slit 119. In FIGS. 2F to 23, the term "contact slit" will hereinafter be referred to as a contact slit 119.

Figure 2E:
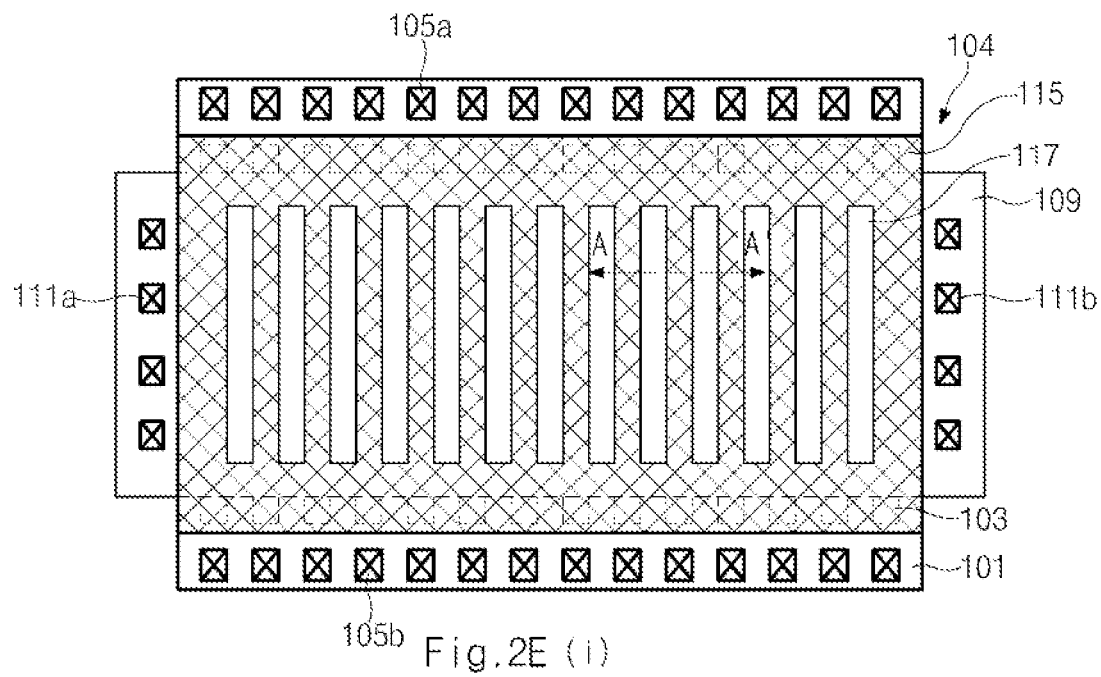
FIGS. 2A(i) to 2J(i) are plan views of a method for forming a semiconductor device according to an embodiment.
Figure 2E:
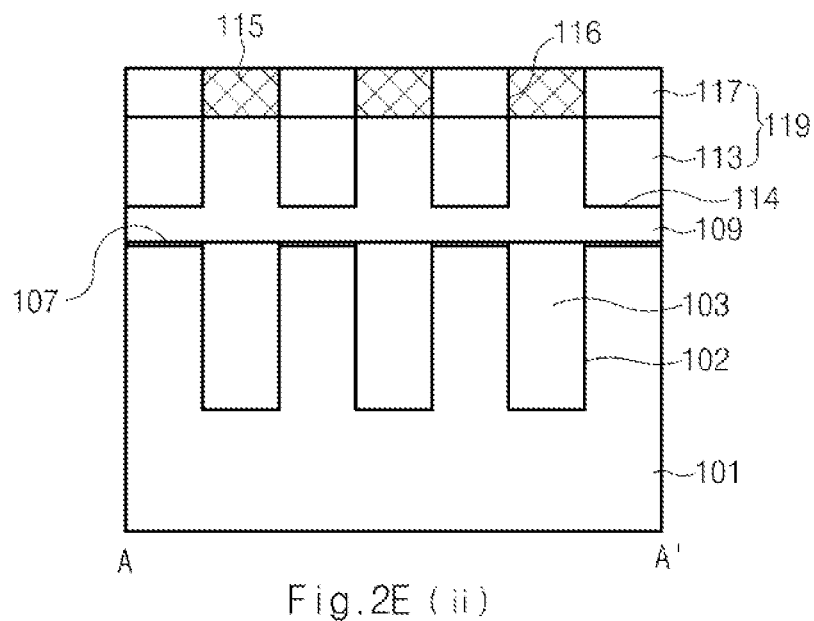

Referring to FIGS. 2C to 2E, for convenience of description and better understanding, after formation of the first contact slit 113, the metal line 115 is formed over the first contact slit 113, and the second contact slit 117 is formed by etching the metal line 115, such that the contact slit 119 is formed. However, the scope or spirit of the embodiment is not limited thereto, and another method for forming the contact slit 119 can be employed. For example, after the second gate electrode 109 and the metal line are sequentially deposited, the metal line 115 and the second gate electrode 109 are sequentially etched so that the contact slit 119 may be formed at a time.

Thereafter, referring to FIG. 2F, an interlayer insulation film 121 may be sequentially deposited over the metal line 115 and the contact slit 119. The interlayer insulation film 121 may be formed of an oxide material. For example, the oxide material may be formed of a High Density Plasma (HDP) oxide film, a Boron Phosphorus Silicate Glass (BPSG) film, a Phosphorus Silicate Glass (PSG) film, a Boron Silicate Glass (BSG) film, a Tetra Ethyl Ortho Silicate (TEOS) film, a Undoped Silicate Glass (USG) film, a Fluorinated Silicate Glass (FSG) film, a Carbon Doped Oxide (CDO) film, an Organo Silicate Glass (OSG) film, etc. In addition, the oxide material may be used as a laminate film including at least two of the above-mentioned films. Alternatively, the oxide material may be formed of a spin-coated film such as a Spin On Dielectric (SOD) film.

In this case, although the embodiment describes that the interlayer insulation film 121 is immediately deposited over the metal line 115, it should be noted that an etch stop film (not shown) may further be deposited between the interlayer insulation film 121 and the metal line 115.

Subsequently, referring to FIG. 2G, the interlayer insulation film 121 is sequentially etched using a lower electrode mask (not shown), so that a lower electrode hole 123 is formed. In this case, the lower electrode hole 123 exposes the metal line 115 or the contact slit 119, so that top surfaces of the metal line 115 and the contact slit 119 are exposed.

Referring to FIG. 2H, a conductive material for forming a lower electrode is filled in the lower electrode hole 123, so that the lower electrode 125 is formed. Subsequently, an interlayer insulation film 121 formed over a sidewall of the lower electrode 125 is etched so that the lower electrode 125 is formed in a pillar shape.

Thereafter, referring to FIG. 2I, a dielectric film 127 is formed to a predetermined thickness along an outer surface of the lower electrode 125.

Referring to FIG. 2J, a conductive material for upper electrode formation is deposited not only over the dielectric film 127 but also over an entire sidewall of the lower electrode 125, so that an upper electrode 129 is formed. Although not shown in the cross-sectional view (ii), third metal contacts (131a, 131b) coupled to the metal line 115 are formed outside of the upper electrode 129 as shown in the plan view (i).

The MOS capacitor B coupled to first and second lower gate electrodes (103, 109) is formed over the contact slit 119 and the cell capacitor C is alternately formed over the metal line 115.

As described above, according to the above-mentioned embodiment, the MOS capacitor is formed in the active region in such a manner that the cell capacitor and the MOS capacitor are alternately arranged to form a reservoir capacitor, such that the size of a wasted region is reduced. Thus, capacitance of the reservoir capacitor can be increased without increase of a unit chip size. Since the reservoir capacitor in a planar MOS type may extend down to the first gate electrode, capacitance of the reservoir capacitor can be maximized. In addition, the first and the second gate electrodes are coupled in a zigzag manner instead of in a straight-line manner, resulting in a capacitance increase.

In addition, the cell capacitor and the MOS capacitor are alternately arranged in such a manner that the capacitors can be coupled in parallel to each other, resulting in an increase of total capacitance of the capacitors.

As is apparent from the above description, the reservoir capacitor is formed by alternately arranging a cell capacitor and a MOS capacitor, such that capacitance increases and the possibility of punching of the cell capacitor is reduced.

Those skilled in the art will appreciate that embodiments may be carried out in other specific ways than those set forth herein without departing from the spirit and essential characteristics of the embodiment. The above exemplary embodiments are therefore to be construed in all aspects as illustrative and not restrictive.

The above embodiments are illustrative and not limitative. Various alternatives are possible. The embodiments are not limited by the type of deposition, etching polishing, and patterning steps described herein. Nor are the embodiments limited to any specific type of semiconductor device. For example, the embodiments may be implemented in a dynamic random access memory (DRAM) device or non-volatile memory device.

What is claimed is:

1. A semiconductor device comprising:
    an active region defined by a device isolation region over a semiconductor substrate of peripheral region;
    gate electrodes disposed over the active region;
    a plurality of metal lines over the gate electrodes;
    a plurality of contact slits, each extending between the gate electrodes and further extending between the plurality of metal lines;
    a plurality of first capacitors respectively disposed over the plurality of metal lines; and
    a plurality of second capacitors respectively disposed over the plurality of contact slits.

2. The semiconductor device according to claim 1, wherein the plurality of the first capacitors and the plurality of the second capacitors are alternately arranged.

3. The semiconductor device according to claim 1, wherein the gate electrodes include:
    a plurality of first gate electrodes spaced apart from each other by a predetermined distance in the active region, wherein the first gate electrodes are formed in a line shape; and
    a second gate electrode extending from the plurality of first gate electrodes and provided in the active region.

4. The semiconductor device according to claim 3, wherein each of the contact slits is formed in the second gate electrode and extends between the plurality of metal lines.

5. The semiconductor device according to claim 3, wherein each of the contact slits is arranged in the second gate electrode, and is located over the active region between respective ones of the first gate electrodes.

6. The semiconductor device according to claim 3,
    wherein top surfaces of each of the contact slits are substantially level with top surfaces of each of the plurality of metal lines, and
    wherein bottom surfaces of each of the contact slits are located in the second gate electrode.

7. The semiconductor device according to claim 1, wherein top surfaces of each of the plurality of contact slits are substantially level with top surfaces of the plurality of metal lines, and
    wherein bottom surfaces of the plurality of contact slits are located at a lower level than bottom surfaces of the plurality of metal lines.

8. The semiconductor device according to claim 1, the device further comprising:
    a gate insulation film formed between the active region and the second gate electrode.

9. The semiconductor device according to claim 1, the device further comprising:
    a metal contact coupled to the plurality of metal lines.

10. The semiconductor device according to claim 1, wherein each of the plurality of the first capacitors and the plurality of the second capacitors respectively include:
    a pillar-shaped lower electrode;
    a dielectric film formed over the lower electrode to a predetermined thickness; and
    an upper electrode formed over the dielectric film.

11. A method for forming a semiconductor device comprising:

forming a plurality of first gate electrodes spaced apart from each other by a predetermined distance in an active region;

forming a second gate electrode over the plurality of first gate electrodes and the active region;

forming a plurality of metal lines spaced apart from each other by a predetermined distance, each of the plurality of metal lines formed over the second gate electrode;

forming a plurality of contact slits extending into the second gate electrode, each of the contact slits placed between respective ones of the plurality of metal lines;

forming a plurality of the second capacitors, each second capacitor formed over a respective one of the plurality of contact slits; and forming a plurality of cell reservoir capacitors, each second capacitor formed over a respective one the plurality of metal lines, wherein the plurality of second capacitors and the plurality of first capacitors are alternately arranged.

12. The method according to claim 11, wherein the forming the plurality of first gate electrodes includes:

etching the active region to form a plurality of trenches spaced apart from each other by a predetermined distance in the active region; and filling a gate material in the plurality of trenches.

13. The method according to claim 11, the method further comprising:

after forming the plurality of first gate electrodes, forming a gate insulation film over the active region between respective ones of the plurality of first gate electrodes.

14. The method according to claim 11, wherein forming the plurality of contact slits includes:

forming the plurality of contact slits in the second gate electrode between respective ones of the plurality of first gate electrodes.

15. The method according to claim 11, wherein forming the plurality of metal lines includes:

forming a plurality of first contact slit holes spaced apart from each other by a predetermined distance by etching the second gate electrode;

forming a plurality of first contact slits by filling a conductive material in the plurality of first contact slit holes;

depositing a metal layer over the plurality of first contact slits and the second gate electrode; and etching the metal layer to divide the metal layer into the plurality of metal lines and form a plurality of second contact slit holes spaced apart from each other by a predetermined distance.

16. The method according to claim 15, the method further comprising:

forming a plurality of second contact slits by filling a conductive material in the plurality of second contact slit holes.

17. The method according to claim 16, wherein the plurality of first contact slits and the plurality of second contact slits include substantially the same material.

18. The method according to claim 11, wherein alternately arranging the plurality of the second capacitors and the plurality of the first capacitors includes:

forming an interlayer insulation film over the plurality of contact slits and the plurality of metal lines;

forming a plurality of lower electrode holes by etching the interlayer insulation film in such a manner that each contact slit and each metal line are alternately exposed;

forming a plurality of lower electrodes by filling a conductive material in the plurality of lower electrode holes;

removing portions of the interlayer insulation film remaining between respective ones of the plurality of lower electrodes;

forming a dielectric film over external surfaces of the plurality of lower electrodes; and forming an upper electrode over the dielectric film.

19. The method according to claim 11, wherein the plurality of the second capacitors are coupled to the second gate electrode, and wherein the plurality of the first capacitors are respectively coupled to the plurality of metal lines.

20. The method according to claim 11, wherein the plurality of contact slits include polysilicon, and the plurality of metal lines include tungsten (W).

* * * * *